(12) United States Patent
Clark et al.

(10) Patent No.: US 10,521,551 B2
(45) Date of Patent: Dec. 31, 2019

(54) METHODS FOR SHIMMING FLEXIBLE BODIES

(71) Applicant: The Boeing Company, Chicago, IL (US)

(72) Inventors: Don Michael Clark, Goose Creek, SC (US); Joshua Gerritt Letendre, North Charleston, SC (US); Steven Elsdon Larson, Maple Valley, WA (US)

(73) Assignee: The Boeing Company, Chicago, IL (US)

( * ) Notice: Subject to any disclaimer, the term of this patent is extended or adjusted under 35 U.S.C. 154(b) by 734 days.

(21) Appl. No.: 14/942,651

(22) Filed: Nov. 16, 2015

(65) Prior Publication Data

US 2017/0138385 A1    May 18, 2017

(51) Int. Cl.
*G06F 17/50* (2006.01)

(52) U.S. Cl.
CPC ...... *G06F 17/5095* (2013.01); *G06F 17/5018* (2013.01)

(58) Field of Classification Search
CPC ............. G06F 17/5095; G06F 17/5018; G05B 19/4099; G05B 19/40931
USPC .......................................................... 700/97
See application file for complete search history.

(56) References Cited

U.S. PATENT DOCUMENTS

| | | | |
|---|---|---|---|
| 4,488,137 A | 12/1984 | Rooney et al. | |
| 4,848,137 A | 7/1989 | Turner et al. | |
| 5,106,290 A | 4/1992 | Carver et al. | |
| 5,278,775 A * | 1/1994 | Bibel | B23P 19/066 702/42 |
| 5,318,394 A | 6/1994 | Pierce et al. | |
| 5,353,884 A | 10/1994 | Misawa et al. | |
| 5,560,102 A | 10/1996 | Micale et al. | |
| 5,737,090 A | 4/1998 | Christopher et al. | |
| 5,875,859 A | 3/1999 | Ikeda et al. | |
| 5,898,494 A | 4/1999 | Csipkes | |
| 6,348,654 B1 * | 2/2002 | Zhang | H05K 9/0015 174/362 |
| 6,430,796 B1 | 8/2002 | Jones et al. | |
| 6,550,129 B1 | 4/2003 | Buttrick, Jr. | |
| 6,618,505 B2 | 9/2003 | Cork et al. | |
| 6,808,143 B2 | 10/2004 | Munk et al. | |
| 6,811,733 B2 | 11/2004 | Nelson et al. | |
| 6,922,599 B2 | 7/2005 | Richey | |

(Continued)

*Primary Examiner* — Brian W Wathen
*Assistant Examiner* — Mohammed Shafayet
(74) *Attorney, Agent, or Firm* — Joseph F. Harding; The Small Patent Law Group LLC

(57) ABSTRACT

A method is provided that includes providing a first digital representation of a first member and a second digital representation of a second member. The first member and the second member are configured to be joined. The method also includes aligning the first digital representation and the second digital representation in a same coordinate system. Further, the method includes determining, in the coordinate system, a virtual deformation corresponding to at least one of the first digital representation or the second digital representation corresponding to an applied loading. Also, the method includes determining shim dimensions for a shim to be interposed between the first member and the second member based on the virtual deformation. The method further includes fabricating a shim having the shim dimensions.

21 Claims, 8 Drawing Sheets

(56) References Cited

U.S. PATENT DOCUMENTS

| | | |
|---|---|---|
| 7,058,213 B2 | 6/2006 | Newman |
| 7,083,143 B2 | 8/2006 | Whitmer et al. |
| 7,195,429 B2 | 3/2007 | Dods et al. |
| 7,214,008 B1 | 5/2007 | Dods et al. |
| 7,487,901 B2 | 2/2009 | Talwar et al. |
| 7,565,206 B2 | 7/2009 | Palti |
| 7,614,159 B2 | 11/2009 | Kilwin et al. |
| 7,621,701 B2 | 11/2009 | Skiles et al. |
| 7,730,789 B2 | 6/2010 | Odendahl |
| 7,756,321 B2 | 7/2010 | Marsh et al. |
| 7,813,830 B2 | 10/2010 | Summers et al. |
| 7,827,012 B2 | 11/2010 | Whitmer |
| 7,974,722 B2 | 7/2011 | Boyl-Davis et al. |
| 8,043,033 B2 | 10/2011 | Clark |
| 8,181,467 B2 | 5/2012 | Kumar et al. |
| 8,272,118 B2 | 9/2012 | Alvez |
| 8,342,444 B2 | 1/2013 | Hartshorn et al. |
| 8,655,480 B1* | 2/2014 | Odendahl ............... B24B 19/22 451/259 |
| 8,756,792 B2 | 6/2014 | Boyl-Davis et al. |
| 9,068,809 B1 | 6/2015 | Lagally et al. |
| 2001/0046323 A1* | 11/2001 | Cork ....................... B64F 5/00 382/203 |
| 2005/0100263 A1 | 5/2005 | Shi et al. |
| 2006/0027630 A1 | 2/2006 | Talwar et al. |
| 2006/0080069 A1* | 4/2006 | Fujimoto ............ G06F 17/5018 703/2 |
| 2006/0269368 A1 | 11/2006 | Skiles et al. |
| 2006/0281041 A1 | 12/2006 | Rubber et al. |
| 2007/0299338 A1 | 12/2007 | Rubber et al. |
| 2008/0027693 A1* | 1/2008 | Khandoker ......... B29C 35/0222 703/7 |
| 2008/0205763 A1* | 8/2008 | Marsh ...................... B64F 5/10 382/190 |
| 2008/0210824 A1* | 9/2008 | Eberth .................... B29C 70/24 244/131 |
| 2008/0223985 A1 | 9/2008 | Marsh et al. |
| 2009/0100791 A1* | 4/2009 | Kayani .................. B64C 3/187 52/745.19 |
| 2009/0101851 A1 | 4/2009 | Spalding |
| 2009/0103113 A1 | 4/2009 | Nygaard et al. |
| 2010/0102482 A1 | 4/2010 | Jones et al. |
| 2010/0308171 A1* | 12/2010 | Kelley .................... B23P 19/04 244/132 |
| 2011/0087358 A1 | 4/2011 | Boyl-Davis et al. |
| 2012/0316666 A1* | 12/2012 | Boyl-Davis ...... G05B 19/40931 700/98 |
| 2015/0127308 A1* | 5/2015 | Thomas, Jr. ......... G06F 17/5018 703/2 |
| 2015/0243077 A1* | 8/2015 | Grip ..................... G06F 17/5018 345/423 |
| 2015/0294032 A1* | 10/2015 | Lagally ................. G06F 17/50 703/1 |
| 2015/0367579 A1* | 12/2015 | Laudrain ............ G05B 19/4099 700/98 |
| 2017/0138385 A1* | 5/2017 | Clark .................... G06F 17/5095 |

\* cited by examiner

METHODS FOR SHIMMING FLEXIBLE BODIES

FIELD OF EMBODIMENTS OF THE DISCLOSURE

Embodiments of the present disclosure generally relate to systems and methods for shimming flexible bodies.

BACKGROUND OF THE DISCLOSURE

Shims may be utilized to account for variances or deviations in surfaces between members to be joined. However, excessively thick shims may conflict with engineering requirements. Further, excessively thick shims may increase the weight of the structure. Also, conventional approaches for sizing shims may not provide shims that are as accurately sized and dimensioned as desired.

SUMMARY OF THE DISCLOSURE

Accordingly, reduction of time and/or expense of selecting, fabricating, and/or utilizing shims used in the joining of members to form a structure are provided in various embodiments disclosed herein.

Certain embodiments of the present disclosure provide a method. The method includes providing a first digital representation of a first member and a second digital representation of a second member. The first member and the second member are configured to be joined. The method also includes aligning the first digital representation and the second digital representation in a same coordinate system. Further, the method includes determining, in the coordinate system, a virtual deformation corresponding to at least one of the first digital representation or the second digital representation corresponding to an applied loading. Also, the method includes determining shim dimensions for a shim to be interposed between the first member and the second member based on the virtual deformation. The method further includes fabricating the shim having the shim dimensions.

Certain embodiments of the present disclosure provide a method. The method includes providing a first member and a second member. The method also includes providing a first digital representation of the first member and a second digital representation of the second member. The first member and the second member are configured to be joined. The method also includes aligning the first digital representation and the second digital representation in a same coordinate system. Further, the method includes determining, in the coordinate system, a virtual deformation corresponding to at least one of the first digital representation or the second digital representation corresponding to an applied loading. Also, the method includes determining shim dimensions for a shim to be interposed between the first member and the second member based on the virtual deformation. The method further includes fabricating the shim having the shim dimensions, and joining the first and second members with the shim interposed therebetween.

Certain embodiments of the present disclosure provide a structure that includes a first member, a second member, and a shim interposed between the first and second members. The shim has shim dimensions selected based on a virtual deformation corresponding to at least one of a first digital representation of the first member or a second digital representation of the second member. The virtual deformation is based on an applied loading.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Embodiments of the present disclosure provide systems and methods for shimming in connection with the joining of flexible bodies, for example bodies that will be flexed under an allowable or predetermined assembly force. Various embodiments provide for reducing shim thickness required to fill a void between mating parts. In various embodiments, a surface profile of one or more mating surfaces may be determined and used to create a digital representation of each mating part. One or more of the mating parts (or a nominal surface corresponding thereto) may be virtually deformed in accordance with forces present during assembly in order to minimize the void between parts. A digital volume may be constructed to fill the void between the virtually deflected parts, and a shim fabricated based on the digital volume.

Embodiments of the present disclosure provide improved joining of flexible bodies, for example improved design and fabrication of shims to be used for joining flexible bodies. Reduction of assembly or fabrication time and/or improvement in quality are accordingly provided as discussed herein.

Figure 1:
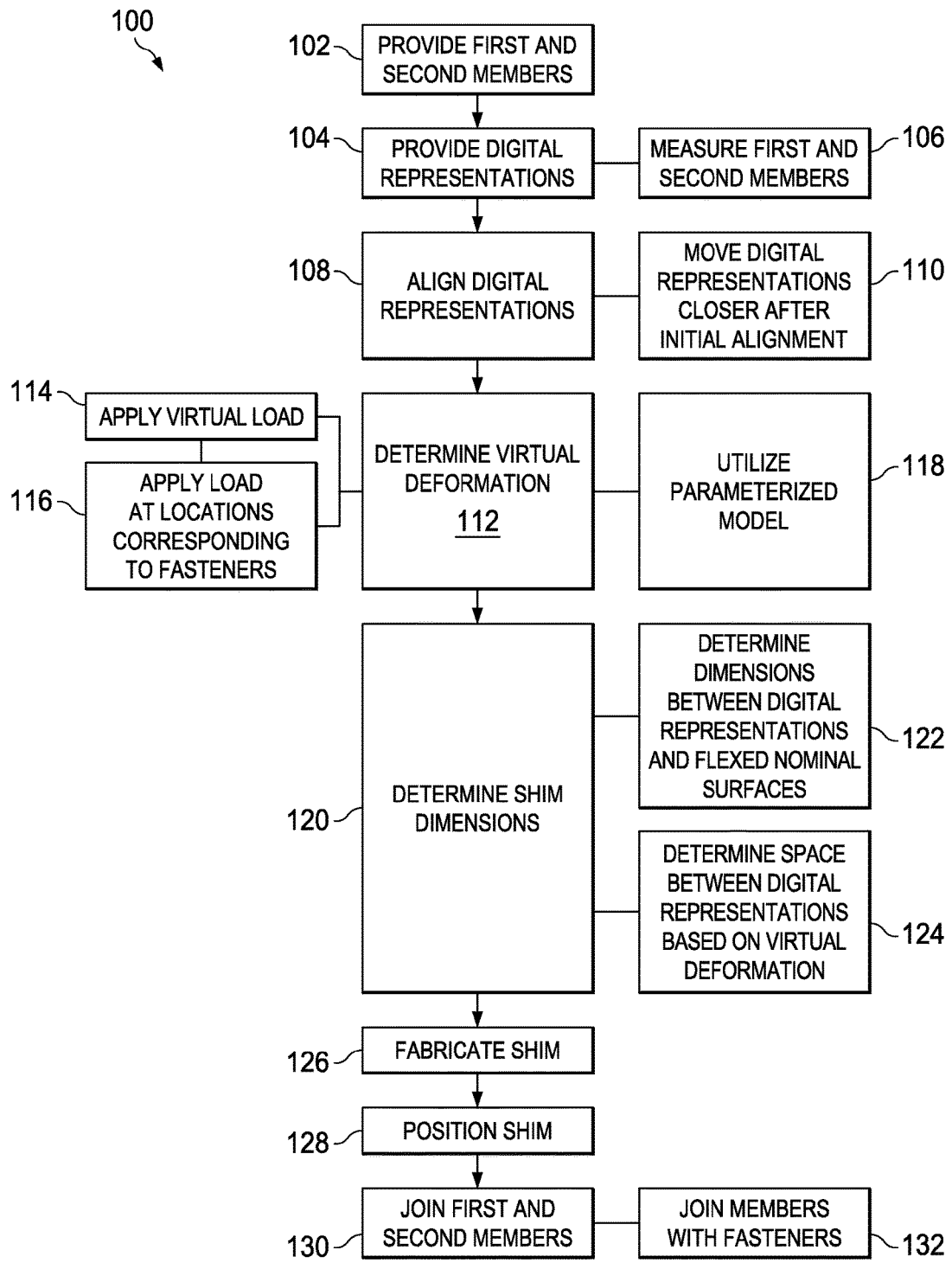
FIG. 1 provides a flowchart of a method according to an embodiment of the present disclosure.

FIG. 1 provides a flowchart of a method 100 (e.g., for providing a structure composed of two or more members), in accordance with various embodiments. The method 100, for example, may employ or be performed by structures or aspects of various embodiments (e.g., systems and/or methods and/or process flows) discussed herein. In various embodiments, certain steps may be omitted or added, certain steps may be combined, certain steps may be performed concurrently, certain steps may be split into multiple steps, certain steps may be performed in a different order, or certain steps or series of steps may be re-performed in an iterative fashion.

Figure 2:
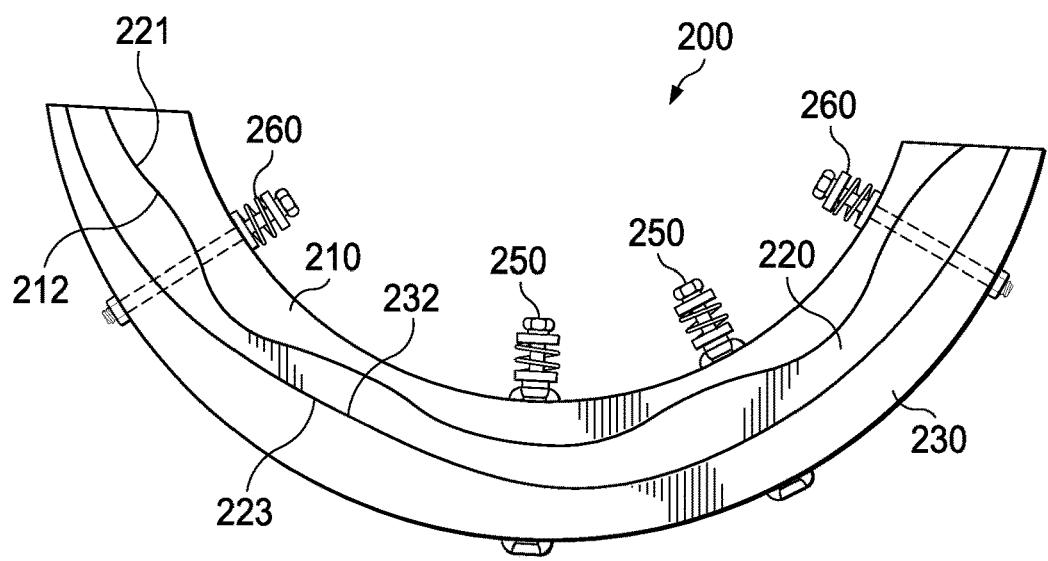
FIG. 2 provides a perspective view of a structure including a first member, a second member, and a shim, according to an embodiment of the present disclosure.

At 102, first and second members are provided. The first and second members are configured to be joined together, for example, along corresponding faces of the first and second members. The first and second members may be joined, for example, to form a structure that may be used as part of an airplane fuselage or wing. For example, FIG. 2 provides a perspective view of a structure 200 in accordance with various embodiments. The structure 200 includes a first member 210 and a second member 230 with a shim 220 interposed between the first member 210 and the second member 230. The first member 210 and the second member 230 may be joined via fasteners 250 and/or fasteners 260. The fasteners, for example, may be spring loaded fasteners. The fasteners 250, for example, may be temporary fasteners used to hold the first member 210, second member 230, and shim 220 in place while pilot holes for permanent fasteners 260 are drilled, and/or other alignment tasks are performed. After the permanent fasteners 260 are installed, the temporary fasteners 250 may be removed. The temporary fasteners 250 may provide a lower joining force than the permanent fasteners 260. In some embodiments, the first member 210 and the second member 230 may be formed from different materials. The first member 210, for example, may be referred to as a frame, and may be made of aluminum or titanium, among others. The second member 230, for example, may be made of a composite material, and may be referred to as a barrel or skin. The shim 220, for example, may be made of fiberglass. It may be noted that a series of shims 220 may be provided along a length of the structure 200. In some embodiments, each shim 220 may extend across a width of the structure 200.

Generally, the shim 220 may be employed to help ensure a correct fit or interaction between the first member 210 and the second member 230. For example, the first member 210 and/or second member 230 may include a surface that deviates from a targeted design state, resulting in gaps between the first member 210 and second member 230 if joined directly. The shim 220 may be sized and configured to eliminate, reduce, or minimize any internal gaps in the structure 200 after the first member 210 and the second member 230 are joined.

Figure 3:
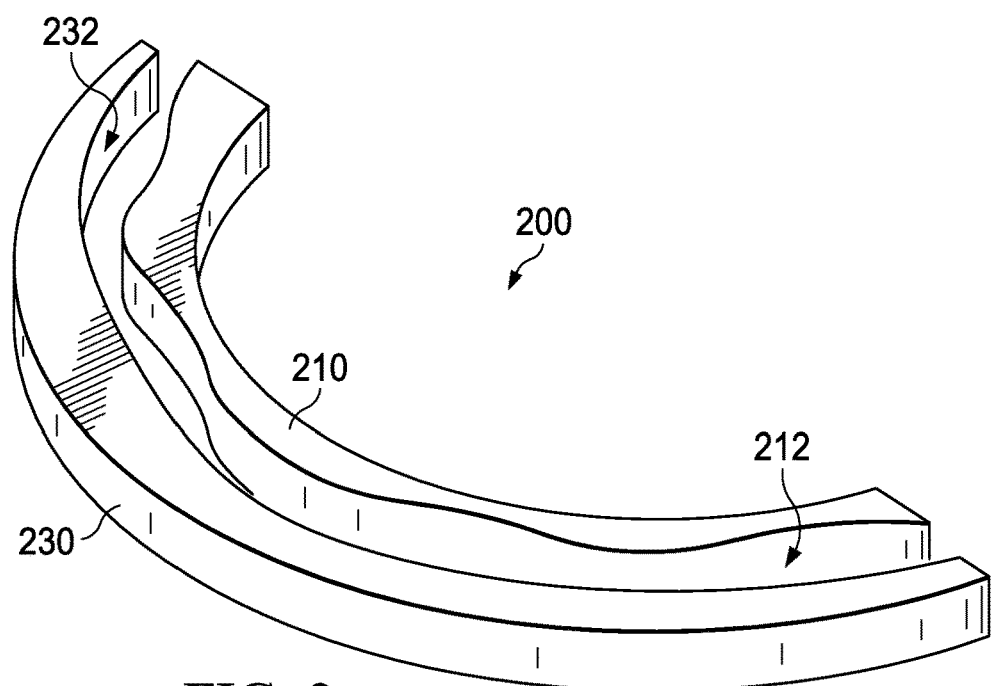
FIG. 3 is a perspective view of the first and second members of the structure of FIG. 2.

FIG. 3 provides a view of the first member 210 and the second member 230 of the structure 200 without the shim 220. As seen in FIGS. 2 and 3, the first member 210 includes a first surface 212, and the second member 230 includes a second surface 232. The first surface 212 and the second surface 232 are oriented toward each other and configured for the shim 220 (not shown in FIG. 3; see, e.g., FIG. 2) to be interposed therebetween.

Returning to FIG. 1, at 104, digital representations of the first and second members are provided. For example, a first digital representation of the first member may be provided, and a second digital representation of the second member may be provided. The digital representations may include a mapping of at least a portion of each of the first and second members. For example, with continued reference to FIG. 3, the digital representations may include a mapping of the first surface 212 and the second surface 232 of the first member 210 and the second member 230, respectively. In some embodiments, the digital representation may be provided by measuring the first member and the second member.

For example, in the example depicted in FIG. 1, at 106, the first member and the second member are measured to provide the first digital representation and the second digital representation. In some embodiments, the first and second members (e.g., one or more surfaces of the first and second members) may be measured with a 3-D scanning device to provide a point cloud or map of at least one surface of each of the first and second members.

At 108, the first digital representation and the second digital representation are aligned in a same coordinate system. The first digital representation and the second digital representation may be aligned based on a desired position at which the first member and the second member are to be joined. For example, the digital representations may be aligned based on one or more base lines or fiducial markers (e.g., a corner or other landmark).

Figure 4:
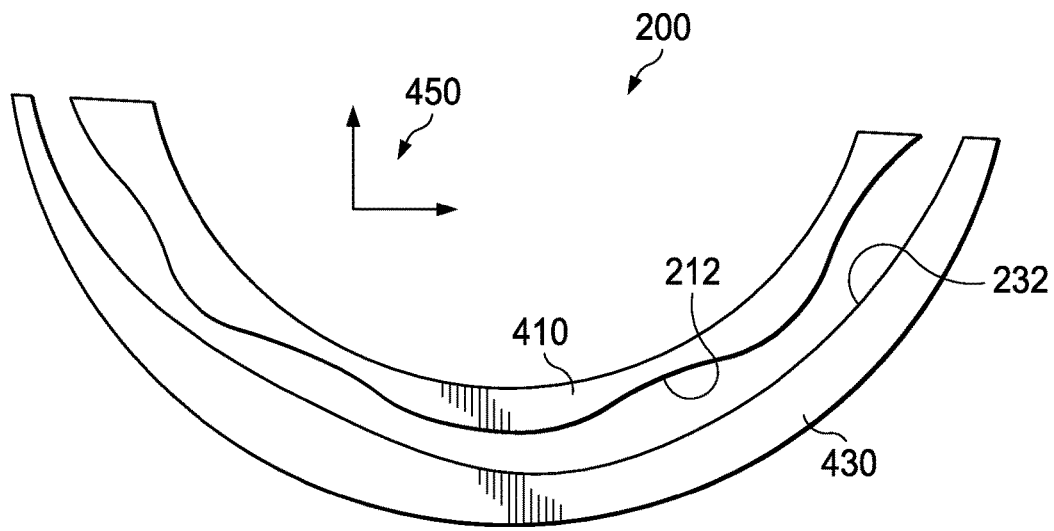
FIG. 4 illustrates an example of aligned digital representations, according to an embodiment of the present disclosure.

FIG. 4 illustrates an example of aligned digital representations. In FIG. 4, a first digital representation 410 and a second digital representation 430 are aligned with respect to each other in a coordinate system 450. In some embodiments, the first digital representation and the second digital representation may be aligned with each other (e.g., oriented with respect to each other and spaced a distance from each other) in a position corresponding to a targeted design condition, or in positions corresponding to a final assembled state. In the illustrated embodiment, the first digital representation 410 corresponds to the first member 210 and includes a point cloud or mapping of the first surface 212, while the second digital representation 430 corresponds to the second member 230 and includes a point cloud or mapping of the second surface 232. The first digital representation 410 and the second digital representation 430 are aligned with each other such that the first surface 212 and the second surface 232 are oriented toward each other. It may be noted that while, for ease and clarity of illustration, the digital representations of FIG. 4 are depicted in only two dimensions, in practice the digital representations may be three-dimensional. In various embodiments, the first surface 212 and the second surface 232 may be spaced from each other. If the first surface 212 and the second surface 232 were to coincide, such a positioning would correspond to shim thickness of zero.

Figure 5:
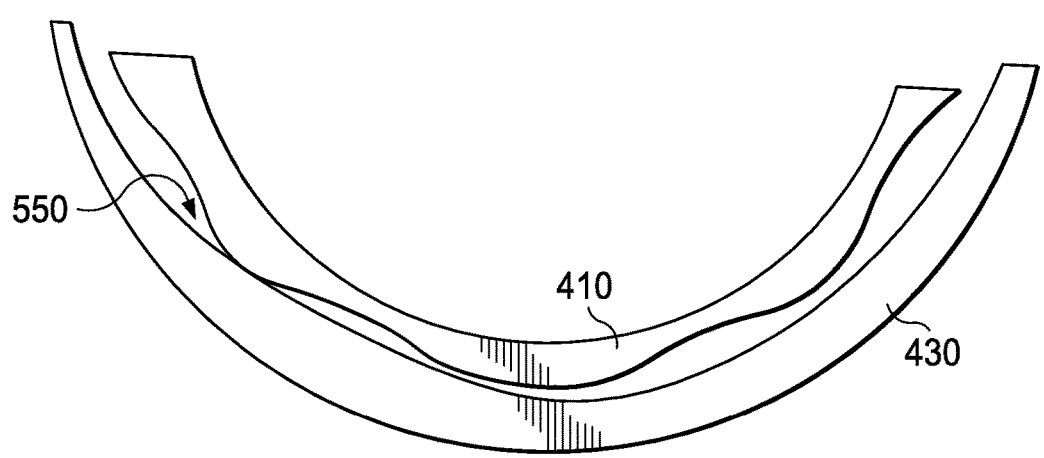
FIG. 5 illustrates an example of aligned digital representations that have been moved closer together.

Returning to FIG. 1, it may be noted that, in some embodiments, the first and second digital representations may be adjusted after an initial alignment. For example, in the illustrated embodiment, at 110, the first and second digital representations are moved closer to each other after an initial alignment in the coordinate system. FIG. 5 illustrates an example of aligned digital representations (e.g., the digital representations 410, 430) of FIG. 4 that have been moved closer together. As seen in FIG. 5, the first digital representation 410 and the second digital representation 430 have been moved closer together than the initial alignment position depicted in FIG. 4. The amount of movement may correspond in various embodiments to a minimum shim thickness. For example, the first digital representation 410 may be moved toward the second digital representation 430 until a minimum distance 550 between the first digital representation 410 and the second digital representation is equal to or a predetermined amount larger than a minimum permissible or desired shim thickness. Moving the digital representations toward each other may help reduce shim thickness and/or improve an assembled orientation of the first and second members. It may be noted that, in various embodiments, the measured or determined surfaces may be moved before, after, or iteratively with flexing of nominal or measured surfaces as discussed herein.

At 112, a virtual deformation corresponding to at least one of the first digital representation or the second digital representation is determined. The virtual deformation in various embodiments may occur due to or correspond to an applied loading. The virtual deformation may be determined in the coordinate system in which the first digital representation and the second digital representation have been positioned and aligned with respect to each other. In some embodiments, the virtual deformation may be determined for both of the first and second digital representations, while in other embodiments a virtual deformation for only one of the first and second digital representations may be determined. The virtual deformation may be determined in some embodiments using a model such as a free body diagram of a digital representation to which one or more forces or loadings are applied. In some embodiments, finite element analysis (FEA) or other computational techniques may be employed to determine the virtual deformation. It may be noted that the virtual deformation may be determined for flexing of one or both of the digital representations themselves, or may be determined for an idealized or nominal surface or representation that may be then be compared to the one or both of the digital representations.

Figure 6:
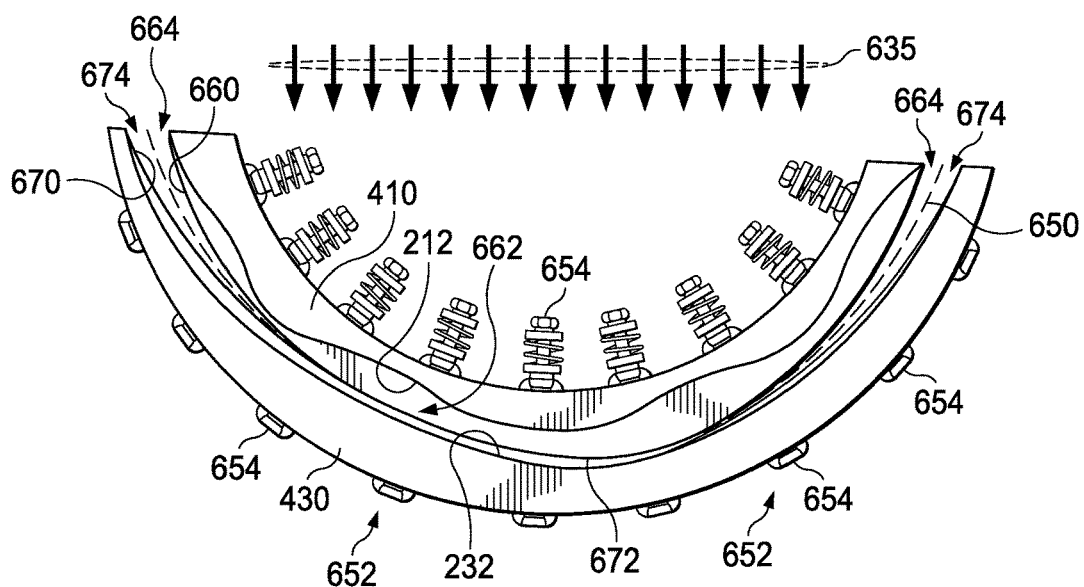
FIG. 6 illustrates an example of determining shim dimensions using flexed nominal surfaces, according to an embodiment of the present disclosure.

In the illustrated embodiment, at 114, a virtual load is applied to at least one of the first or second digital representations. The virtual load corresponds to the applied loading. The applied loading is a load (or set of loads) to which the first and second members will be subjected during assembly and/or during use. The virtual load models the applied loading. For example, the first and second members may be joined by a series of fasteners providing a predetermined joining force to the first and second members. At 116, the virtual load may then be applied to the first and/or second digital representation at locations corresponding to the locations of the fasteners along the first and second members and at magnitudes corresponding to the joining forces provided by the fasteners. Other loads may be applied in various embodiments additionally or alternatively. For example, for cantilevered structures that may be subjected to a gravitational force, a virtual gravitational force may be applied to one or both of the first and second digital representations. For instance, a force 635 as shown in FIG. 6 may be applied if the first member 210 and the second member 230 are cantilevered from the left edge as seen in FIG. 6.

In some embodiments, determining the virtual deformation may include, at 118, utilizing a parameterized model of at least one of the first member or second member. Generally, a model of one or both of the members may be constructed that represents the physical structure of the member. The size, shape, material, amount and distribution of expected loadings, and any mounting points or constraints may be included in the model. Then, one or more of the characteristics of the model (e.g., an amount of force applied, or a thickness of a member, among others) may be varied over an expected or acceptable range of values, and the amount of deformation determined across the range. Then, the amount of deformation may be parameterized based on the one or more characteristics. For example, a finite element analysis may be performed on a model of the first member (or frame) using a range of virtual loadings to develop the parameterized model. Additional details regarding parameterization may be found at FIG. 11 and the related discussion. It may be noted that parameterizing the predicted flexure of parts, for example within the limits of an allowable force, may allow shape change or deflection to be quickly predicted without having to create a finite element model each time a shim is designed.

At 120, shim dimensions are determined for a shim to be interposed between the first member and the second member based on the virtual deformation. For example, after the virtual deformation has been determined, the resulting dimensions of the first and second surfaces of the first and second digital representations, and the distances therebetween, may be used to determine the size and shape of a shim to be disposed between the first and second members. Accordingly, in various embodiments, by accounting for, modeling, or predicting the amount of deformation that the first and/or second members will be subject to when joined, a more accurately sized and dimensioned shim may be provided. Various different techniques for determining the shim dimensions may be utilized in various embodiments.

As one example, at 122, dimensions between the first digital representation and a first flexed nominal mating surface are determined, and dimensions between the second digital representation and a second flexed nominal mating surface are determined. The nominal surface corresponds to an ideal or design state. It may be noted that, in some embodiments, measured and nominal surfaces may be oriented such that a negative shim thickness value may be generated from one measured surface (e.g., from a first surface to a nominal surface), if the shim thickness at the corresponding location (e.g., from a second surface to a nominal surface) has a greater absolute value, resulting in a combined positive shim thickness.

Figure 14:
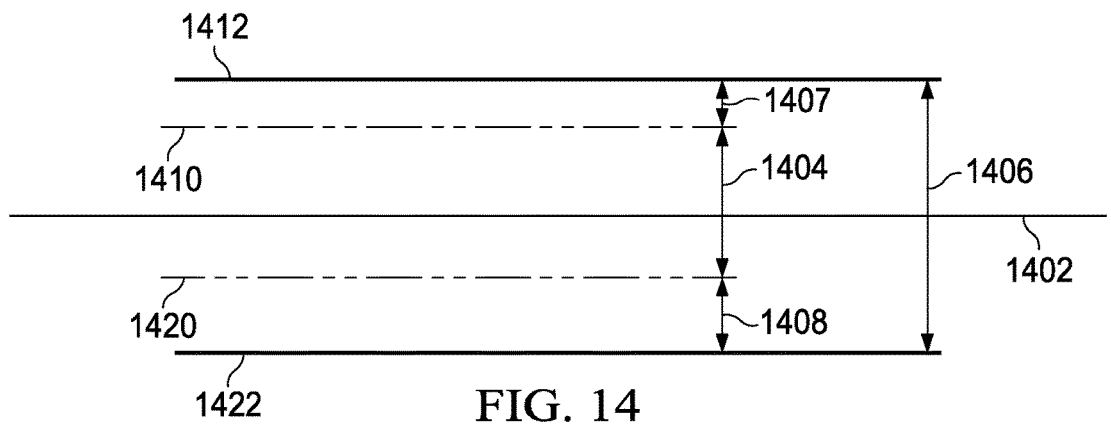
FIG. 14 is a schematic depiction of spaces between first and second members, according to an embodiment of the present disclosure.

FIG. 6 illustrates an example of determining shim dimensions using flexed nominal surfaces in accordance with various embodiments. For example, in FIG. 6, the first digital representation 410 and the second digital representation 430 are shown. Interposed between the first digital representation 410 and the second digital representation is a nominal mating surface 650. The nominal mating surface 650 describes the mating between an ideal first and second member, or the mating surface between the first member 210 and the second member 230 in a design state, without force applied. The difference between the first digital representation 410 and the nominal mating surface 650 corresponds to the variance or deviation in the actual first member 210 from a theoretical design target, and the difference between the second digital representation 430 and the nominal mating surface 650 corresponds to the variance or deviation in the actual second member 230 from the theoretical design target. In some embodiments, the first and second digital representations 410, 430 may be spaced or offset an additional distance from the nominal mating surface 650 to provide a minimum shim thickness. For example, as seen in FIG. 14, a first phantom line 1410 corresponds to an initial positioning of the first member 210 on one side of a minimal mating surface 1402, and a second phantom line 1420 corresponds to an initial positioning of the second member 230. A distance 1404 between the first phantom line 1410 and the second phantom line 1420 as seen in FIG. 14 is less than a minimum shim thickness 1406. Accordingly, the first member 210 may be repositioned to a position corresponding to a first solid line 1412 and the second member 230 may be repositioned to a position corresponding to the second solid line 1422 to provide the minimum shim thickness 1406.

To size a shim (e.g., shim 220) to be produced, the nominal mating surface 650 may be replaced by one or more surfaces representing a perfect or ideal part in a flexed condition (e.g., in a condition resulting from application of a load or loads the part will experience). In the illustrated embodiment, a distributed load 652 (e.g., a load corresponding to a load provided by a group of fasteners 654 configured to hold the first and second members together) is applied to a perfect or ideal part corresponding to the first member 210 to provide a first flexed nominal mating surface 660. As seen in FIG. 6, the first flexed nominal mating surface 660 is closer to the first surface 212 than the nominal mating surface 650, and defines a void 662 between the first flexed nominal mating surface 660 and the first surface 212. The void 662 may be used to size a shim (e.g., shim 220) to be produced. A space 664 between the first flexed nominal mating surface 660 and the nominal mating surface 650 represents a shim volume that may be saved by utilizing the first flexed nominal mating surface 660 instead of the nominal mating surface 650.

As also seen in FIG. 6, the distributed load 652 (e.g., the load corresponding to a load provided by the group of fasteners 654 configured to hold the first and second members together) is applied to a perfect or ideal part corresponding to the second member 230 to provide a second flexed nominal mating surface 670. As seen in FIG. 6, the second flexed nominal mating surface 670 is closer to the second surface 232 than the nominal mating surface 650, and defines a void 672 between the second flexed nominal mating surface 670 and the second surface 232. The void 672 may be used to determine a portion of a shim size. For example, the volume of the void 672 may be added to the volume of the void 662 to determine a shim volume 802 (see FIG. 8). A space 674 between the second flexed nominal mating surface 670 and the nominal mating surface 650 represents a shim volume 802 (see FIG. 8) that may be saved by utilizing the second flexed nominal mating surface 670 instead of the nominal mating surface 650.

Figure 7:
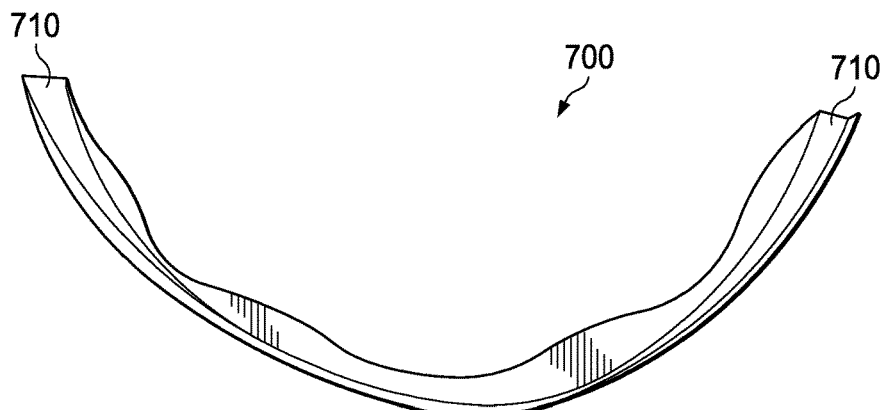
FIG. 7 illustrates an example shim formed by using a difference between the nominal mating surface and the first and second surfaces of FIG. 6.
Figure 8:
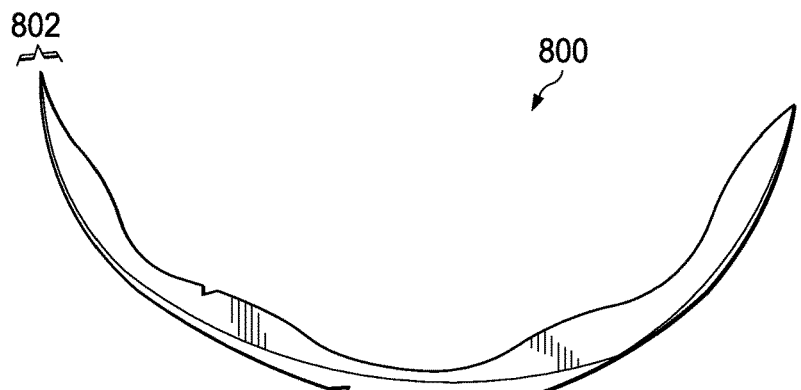
FIG. 8 illustrates an example shim formed by using a difference between the first and second surfaces, and the first and second flexed nominal mating surfaces of FIG. 6, according to an embodiment of the present disclosure.

FIG. 7 illustrates an example shim 700 formed by using a difference between the nominal mating surface 650 and the first and second surfaces 212, 232. FIG. 8 illustrates an example shim 800 formed by using a difference between the first and second surfaces 212, 232, and the first and second flexed nominal mating surfaces 660, 670, respectively (or from adding the volumes of the voids 662, 672). As seen in FIG. 7 and FIG. 8, a volume 710 corresponding to the volumes of the spaces 664, 674 that is present in the shim 700, may be removed from the shim 800, thereby saving space as well as providing a more accurate shim 800 for use when the first member 210 and the second member 230 are flexed.

Returning to FIG. 1, as another example, at 124, shim dimensions are determined based on a space between the first digital representation 410 and the second digital representation 430 based on the virtual deformation. (See FIGS. 9-10 and related discussion). For example, one or both of the first digital representation 410 or the second digital representation 430 may be virtually deformed (e.g., based on a known loading 652 applied to the first member 210 and the second member 230), and a space between the first digital representation 410 and second digital representation 430 used to determine dimensions for the shim 220.

Figure 9:
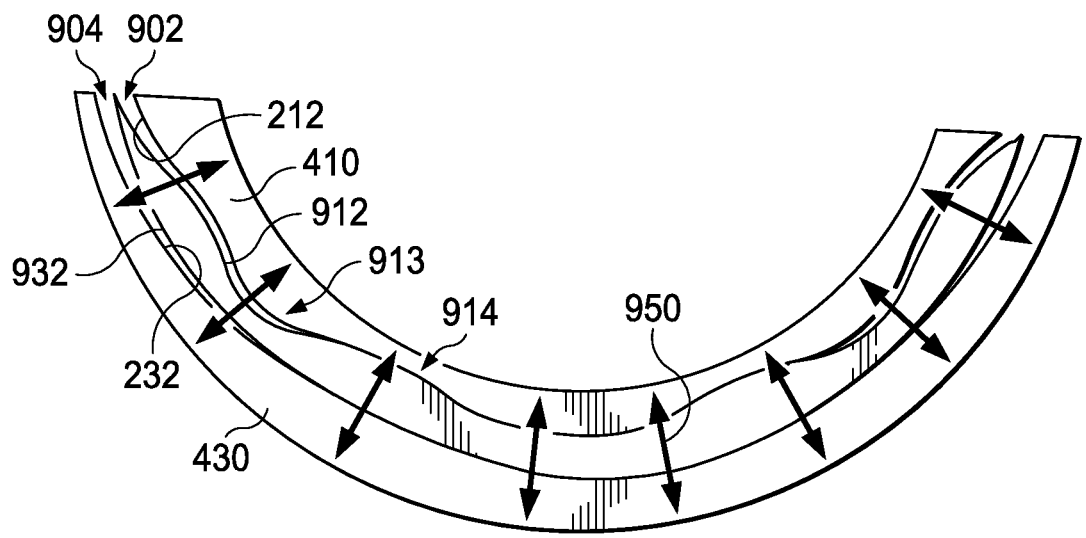
FIG. 9 illustrates an example of determining shim dimensions using flexed digital representations, according to an embodiment of the present disclosure.
Figure 10:
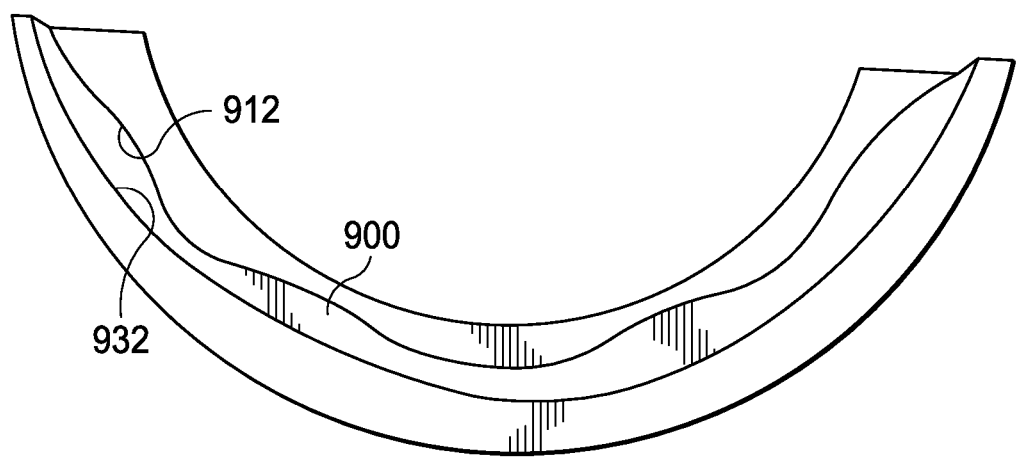
FIG. 10 illustrates an example shim formed by using a space between flexed digital representations of FIG. 9.

FIG. 9 illustrates an example of determining dimensions for a shim (e.g., shim 220) using flexed digital representations (e.g., 912, 932) in accordance with various embodiments, and FIG. 10 illustrates an example shim formed by using a space between flexed digital representations of FIG. 9. As seen in FIGS. 9 and 10, a space 902 exists between the first surface 212 of the first digital representation 410 and a first flexed surface 912 of the first digital representation 410 in a flexed condition. For example, a distributed load 950 corresponding to a joining load provided by fasteners may be applied to the first digital representation 410 to determine the first flexed surface 912. For example, by knowing the size and material of the first member 210 corresponding to the first digital representation 410 as well as the amount and location of the forces comprising the distributed load 950, the amount of flexing or distorting of the first digital representation 410 under the distributed load 950 may be computed to determine the location 913 and profile 914 of the first flexed surface 912.

Similarly, the distributed load 950 may be applied to the second digital representation 430 to determine a second flexed surface 932. For example, by knowing the size and material of the second member 230 corresponding to the second digital representation 430 as well as the amount and location of the forces comprising the distributed load 950, the amount of flexing or distorting of the second digital representation 430 under the distributed load 950 may be computed to determine the location and profile of the second flexed surface 932. As seen in FIG. 9, a space 904 exists between the second surface 232 of the second digital representation 430 and the second flexed surface 932 of the second digital representation 430 in a flexed condition. The spaces 902, 904 correspond to shim material saved by use of flexed digital representations to form a shim 900.

At 126, a shim (e.g., shim 220) is fabricated using shim dimensions determined at 120. The shim, for example, may be machined out of fiberglass. It may be noted that, in various embodiments, a group of shims may be fabricated using the shim dimensions. For example, a series of shims 220 may be positioned along a length of a structure (e.g., structure 200) formed with a first member (e.g., first member 210) and a second member (e.g., second member 230). The shim 220 (or shims) may also be provided with holes, slots or other openings configured to accept fasteners that are configured to join the first member 210 and the second member 230.

At 128, the shim 220 (or shims) is positioned between the first member 210 and the second member 220. The shim 220 may be positioned so that a first face 221 of the shim 220 (that has a profile matching or complementary to the first surface 212 of the first member 210) is oriented toward the first member 210, while an opposed second face 223 of the shim 220 (that has a profile matching or complementary to the second surface 232 of the second member 230) is oriented toward the second member 230. It may be noted that in some embodiments, a deviation of the second member 230 may be transferred to the side of the shim 220 corresponding to first member 210. Flexibility of shim 220 may be utilized to achieve such a transfer in practice.

At 130, the first member 210 and second member 210 are joined. The shim 220 is interposed between the first member 210 and second member 230 when they are joined. The first member 210 and second member 230 may be joined with fasteners. For example, at 132, fasteners that provide an applied loading corresponding to a virtual loading used to determine a virtual deformation as discussed herein are used to join the first member 210 and the second member 230. The fasteners, for example, may be spring-loaded and provide a predetermined amount of joining force 652 or loading to the first member 210 and the second member 230.

In practice, the virtual loading modeled need not generally correspond to the loading provided by permanent fasteners (e.g., fasteners 260) used to join the members (e.g., first member 210 and second member 230). The virtual loading may instead generally correspond to temporary, pseudo-fasteners (e.g., fasteners 250) used to hold the first member 210, shim 220, and second member 230 together while operations such as part alignment and pilot hole drilling take place. These pseudo-fasteners may be generally limited to apply a much smaller force than the fasteners used to permanently join the first member 210 and the second member 230. The limit of the force provided by the pseudo-fasteners is generally specified by engineering requirements. The engineering requirements may also specify the maximum gap that is allowed to exist while the limited force is applied. The force applied by the permanent fasteners may be generally large enough to close gaps between members without shimming, but may induce a high level of stress into the members in the process. It may be noted that the virtual force may represent any number of forces used during the assembly process.

Figure 11:
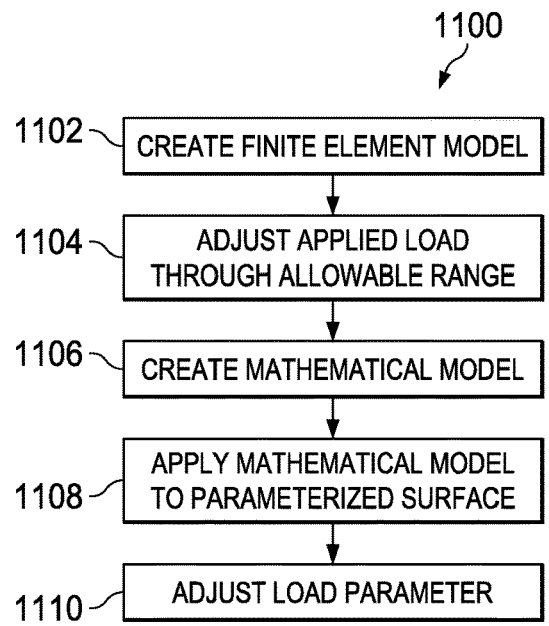
FIG. 11 provides a flowchart of a method according to an embodiment of the present disclosure.

As noted herein, in various embodiments, a parameterized model of at least one of the first member 210 or second member 230 may be utilized to determine a virtual deformation corresponding to at least one of the first digital representation 410 or second digital representation 430. FIG. 11 provides a flowchart of a method 1100 in accordance with various embodiments. The method 1100, for example, may employ or be performed by structures or aspects of various embodiments (e.g., systems and/or methods and/or process flows) discussed herein. In various embodiments, certain steps may be omitted or added, certain steps may be combined, certain steps may be performed concurrently, certain steps may be split into multiple steps, certain steps may be performed in a different order, or certain steps or series of steps may be re-performed in an iterative fashion.

At 1102, a finite element model of the first member 210 or second member 230 is created. For example, the first member 210 or frame may be modeled based on the geometrical dimensions of the first member 210, the material of the first member 210, and the load 632 applied to the first member 210, as well as any constraints on the motion of the first member 210 (e.g., constraints provided by an assembly jig used during joining of the first member 210 and the second member 230).

At 1104, an applied load 632 (e.g., a load applied to the finite element model) is adjusted through an allowable range, with the results (e.g., deflection or deformation of the finite element model under each load adjustment) collected, tabulated, and/or exported for further analysis. Alternatively or additionally, other aspects of the finite element model may be adjusted over a range, such as the location of the applied forces, the thickness of the first member 210 or frame, or the restraints, supports, or boundary conditions, among others.

At 1106, a mathematical model is created. The mathematical model may be a model of deflection or deformation (in one or more directions) of the first member 210 or frame as a function of the applied load 632 (and/or other aspects of the finite element model varied at 1104), based on the results collected at 1104.

At 1108, the mathematical model is applied to a parameterized surface representing a part (e.g. a CAD surface representing a part). For example, a nominal or measured CAD surface may be utilized, with the mathematical model applied to the CAD surface to provide a parameterized deflected or deformed surface. In some embodiments, the parameterized deflected or deformed surface may be utilized to determine shim dimensions.

In the illustrated embodiment, at 1110, the load parameter is adjusted to optimize a shim profile (e.g., 914). For example, by adjusting the load on one or more fasteners 250 providing a distributed load 632 and thereby adjusting the deflection of one or more of the member 210 or the second member 230, a shim profile (e.g., 914) may be reduced and/or made more uniform.

Figure 12:
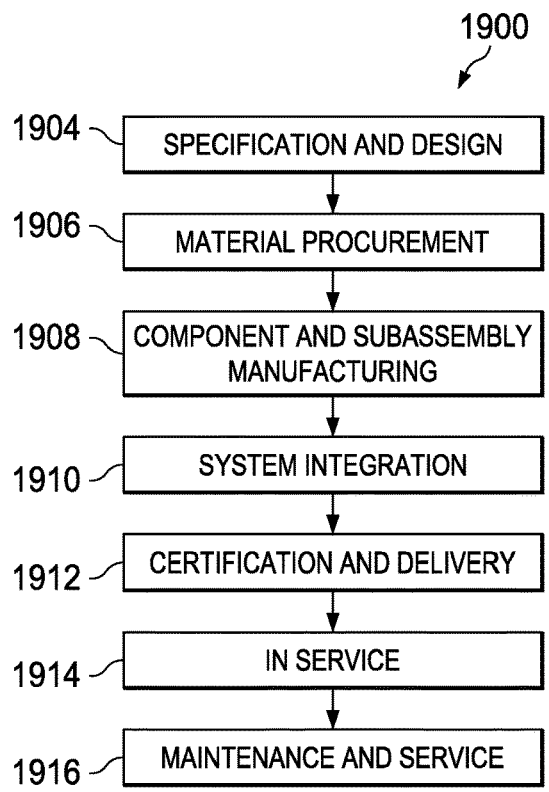
FIG. 12 is a block diagram of aircraft production and service methodology.
Figure 13:
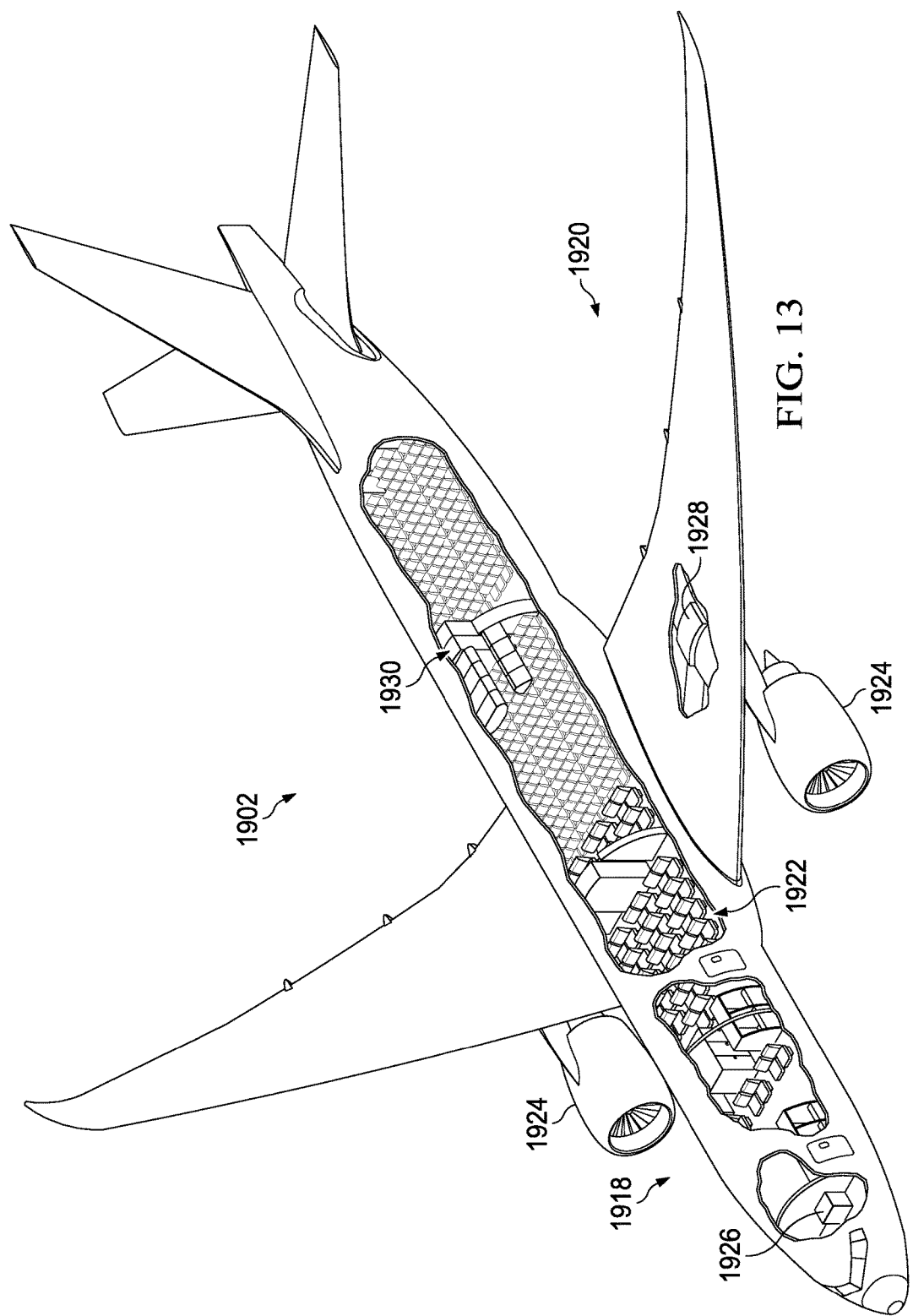
FIG. 13 is a schematic illustration of an aircraft.

Examples of the present disclosure may be described in the context of aircraft manufacturing and service method 1900 as shown in FIG. 12 and aircraft 1902 as shown in FIG. 13. During pre-production, illustrative method 1900 may include specification and design (block 1904) of aircraft 1902 and material procurement (block 1906). During production, component and subassembly manufacturing (block 1908) and system integration (block 1910) of aircraft 1902 may take place. Thereafter, aircraft 1902 may go through certification and delivery (block 1912) to be placed in service (block 1914). While in service, aircraft 1902 may be scheduled for routine maintenance and service (block 1916). Routine maintenance and service may include modification, reconfiguration, refurbishment, etc. of one or more systems of aircraft 1902. For example, in various embodiments, examples of the present disclosure may be used in conjunction with one or more of blocks 1908, 1910, or 1916.

Each of the processes of illustrative method 1900 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 13, aircraft 1902 produced by illustrative method 1900 may include airframe 1918 with a plurality of high-level systems 1920 and interior 1922. Examples of high-level systems 1920 include one or more of propulsion system 1924, electrical system 1926, hydraulic system 1928, and environmental system 1930. Any number of other systems may be included. Although an aerospace example is shown, the principles disclosed herein may be applied to other industries, such as the automotive industry. Accordingly, in addition to aircraft 1902, the principles disclosed herein may apply to other vehicles, e.g., land vehicles, marine vehicles, space vehicles, etc. In various embodiments, examples of the present disclosure may be used in conjunction with one or more of airframe 1918 or interior 1922.

Apparatus(es) and method(s) shown or described herein may be employed during any one or more of the stages of the manufacturing and service method 1900. For example, components or subassemblies corresponding to component and subassembly manufacturing 1908 may be fabricated or manufactured in a manner similar to components or subassemblies produced while aircraft 1902 is in service. Also, one or more examples of the apparatus(es), method(s), or combination thereof may be utilized during production stages 1908 and 1910, for example, by substantially expediting assembly of or reducing the cost of aircraft 1902. Similarly, one or more examples of the apparatus or method realizations, or a combination thereof, may be utilized, for example and without limitation, while aircraft 1902 is in service, e.g., maintenance and service stage (block 1916).

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the spirit and scope of the present disclosure.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A method comprising:
   providing a first digital representation of a first member and a second digital representation of a second member, wherein the first member and the second member are configured to be joined;
   aligning the first digital representation and the second digital representation in a same coordinate system;
   determining, in the coordinate system, a virtual deformation corresponding to at least one of the first digital representation or the second digital representation corresponding to an applied loading, the virtual deformation corresponding to a gap formed between the first digital representation and the second digital representation responsive to the applied loading;
   determining shim dimensions for a shim to be interposed between the first member and the second member to fill the gap formed between the first digital representation and the second digital representation based on the virtual deformation; and
   fabricating the shim having the shim dimensions.

2. The method of claim 1, wherein determining the virtual deformation comprises applying a virtual loading corresponding to the applied loading.

3. The method of claim 2, wherein the virtual loading corresponds to a distributed load provided by plural fasteners configured to join the first member and the second member together.

4. The method of claim 1, wherein determining the virtual deformation comprises utilizing a parameterized model of at least one of the first member or the second member.

5. The method of claim 4, further comprising performing a finite element analysis on the at least one of the first member or the second member using at least one of a range of virtual loadings, a range of restraints, or a range of boundary conditions to develop the parameterized model.

6. The method of claim 1, further comprising measuring the first member and the second member to provide the first digital representation and the second digital representation, respectively.

7. The method of claim 6, wherein measuring the first member comprises determining a first point cloud corresponding to a first surface of the first member, and measuring the second member comprises determining a second point cloud corresponding to a second surface of the second member, the first surface and the second surface oriented toward each other and configured to have the shim interposed therebetween.

8. The method of claim 1, further comprising moving the first digital representation and the second digital representation closer to each other after an initial alignment in the coordinate system.

9. The method of claim 1, wherein determining the shim dimensions comprises determining dimensions of a space between the first digital representation and the second digital representation based on the virtual deformation.

10. The method of claim 1, wherein determining the shim dimensions comprises determining dimensions between the first digital representation and a first flexed nominal mating surface, and determining dimensions between the second digital representation and a second flexed nominal mating surface.

11. A method comprising:
providing a first member and a second member configured to be joined to each other;
providing a first digital representation of the first member and a second digital representation of the second member;
aligning the first digital representation and the second digital representation in a same coordinate system;
determining, in the coordinate system, a virtual deformation corresponding to at least one of the first digital representation or the second digital representation corresponding to an applied loading, the virtual deformation corresponding to a gap formed between the first digital representation and the second digital representation responsive to the applied loading;
determining shim dimensions for a shim to be interposed between the first member and the second member to fill the gap formed between the first digital representation and the second digital representation based on the virtual deformation;
fabricating the shim having the shim dimensions; and
joining the first and second members with the shim interposed therebetween.

12. The method of claim 11, wherein determining the virtual deformation comprises applying a virtual loading corresponding to the applied loading.

13. The method of claim 12, wherein the virtual loading corresponds to a distributed load provided by plural fasteners configured to join the first member and the second member together, and wherein joining the first and second members comprises joining the first and second member with the plural fasteners.

14. The method of claim 13, wherein the plural fasteners are temporary fasteners, the method further comprising joining the first member and the second member with permanent fasteners and removing the temporary fasteners.

15. The method of claim 11, wherein determining the virtual deformation comprises utilizing a parameterized model of at least one of the first member or the second member.

16. The method of claim 15, further comprising performing a finite element analysis on the at least one of the first member or the second member using at least one of a range of virtual loadings, a range of restraints, or a range of boundary conditions to develop the parameterized model.

17. The method of claim 11, further comprising measuring the first member and the second member to provide the first digital representation and the second digital representation, respectively.

18. The method of claim 17, wherein measuring the first member comprises determining a first point cloud corresponding to a first surface of the first member, and measuring the second member comprises determining a second point cloud corresponding to a second surface of the second member, the first surface and the second surface oriented toward each other and configured to have the shim interposed therebetween.

19. The method of claim 11, further comprising moving the first digital representation and the second digital representation closer to each other after an initial alignment in the coordinate system.

20. The method of claim 11, wherein determining the shim dimensions comprises determining dimensions of a space between the first digital representation and the second digital representation based on the virtual deformation.

21. The method of claim 11, wherein determining the shim dimensions comprises determining dimensions between the first digital representation and a first flexed nominal mating surface, and determining dimensions between the second digital representation and a second flexed nominal mating surface.

* * * * *